(12) United States Patent
Briaire

(10) Patent No.: US 10,715,171 B1
(45) Date of Patent: Jul. 14, 2020

(54) VOLTAGE-MODE DAC DRIVER WITH PARALLEL OUTPUT RESISTANCE TUNING

(71) Applicant: Aquantia Corporation, San Jose, CA (US)

(72) Inventor: Joseph Briaire, Mol (BE)

(73) Assignee: Marvell Asia Pte., LTD, Singapore (SG)

( * ) Notice: Subject to any disclaimer, the term of this patent is extended or adjusted under 35 U.S.C. 154(b) by 0 days.

(21) Appl. No.: 16/354,525

(22) Filed: Mar. 15, 2019

(51) Int. Cl.
  *H03M 1/80* (2006.01)
  *H03M 1/06* (2006.01)
  *H03M 1/68* (2006.01)

(52) U.S. Cl.
  CPC ......... *H03M 1/808* (2013.01); *H03M 1/0678* (2013.01); *H03M 1/685* (2013.01)

(58) Field of Classification Search
  CPC ..... H03M 1/808; H03M 1/0678; H03M 1/685
  USPC .................................................. 341/144, 153
  See application file for complete search history.

(56) References Cited

U.S. PATENT DOCUMENTS

| | | | |
|---|---|---|---|
| 5,059,978 A | 10/1991 | Valdenaire | |
| 6,061,010 A | 5/2000 | Adams et al. | |
| 7,501,970 B2 * | 3/2009 | Trifonov | H03M 1/682 341/144 |
| 7,675,450 B1 | 3/2010 | Tabatabaei et al. | |
| 7,714,759 B1 | 5/2010 | Mu | |
| 8,643,520 B1 * | 2/2014 | Huo | H03M 1/068 341/136 |
| 9,413,381 B2 * | 8/2016 | Vasani | H03M 1/002 |
| 9,583,241 B1 | 2/2017 | Dempsey | |
| 9,621,181 B2 * | 4/2017 | Kuo | H03M 1/808 |
| 2008/0001801 A1 | 1/2008 | Nhuyen | |
| 2010/0052963 A1 | 3/2010 | Soude et al. | |

* cited by examiner

*Primary Examiner* — Brian K Young

(57) ABSTRACT

A voltage-mode digital-to-analog converter (DAC) includes input circuitry and an array of output impedance units disposed in parallel. The input circuitry receives a digital word of N bits. A selectable number of the output impedance units are activated to produce a desired aggregate output impedance. The selectable number is free to be a number different than N.

17 Claims, 4 Drawing Sheets

US 10,715,171 B1

VOLTAGE-MODE DAC DRIVER WITH PARALLEL OUTPUT RESISTANCE TUNING

TECHNICAL FIELD

The disclosure herein relates to the field of digital to analog conversion.

BACKGROUND

Digital-to-analog converters (DACs) play a critical role in transforming information from a digital domain into an analog domain. DACs generally convert an abstract finite precision number (such as a fixed-point binary number) into a physical quantity (such as a voltage or current). The number of output levels for a given DAC generally corresponds to its resolution, which is based on the number of "bits" of a given digital code that defines each output level. A variety of DAC architectures exist, including voltage-mode schemes and current steering schemes.

FIG. 1 illustrates a voltage-mode DAC, generally designated 100. The DAC includes a data input 102 that receives a data word of multiple bits during a bit time and a clock input 104 that receives a clock. Respective supply (VDD) and ground (VSS) reference voltages are provided to the DAC. Switch circuitry (not shown) responds to the clock to generate corresponding outputs that are weighted and summed to create an overall output voltage level corresponding to the input word code, but in the analog domain. An important consideration in achieving successful operation of the DAC involves maintaining an aggregate matching characteristic impedance for the output of the DAC, such as, for example 50 ohms.

FIG. 2 illustrates one conventional approach in tuning a DAC output impedance to exhibit an aggregate output impedance of 50 ohms for a DAC. The DAC includes respective DAC drivers $200_0$-$200_{n-1}$ for processing each "bit" $b_0$-$b_{n-1}$ of the input N-bit word. Each driver, or bit slice, includes an output impedance unit 202 that exhibits an output resistance $R_{OUT}$. Switch circuitry 204 selectively couples the impedance to the output "output" based on the value of the received input bit. Since multiple drivers are employed, sample-to-sample variations may cause the actual resistance of each output impedance unit to vary.

One solution to providing a post-silicon tuning method, illustrated in FIG. 3, involves configuring each output impedance unit as multiple separately selectable impedance units in series, such as shown in 302. A large impedance of, for example, 14 kohms, may be activated by switch 304, and tuned by selectively switching in one or more smaller impedance units of, for example, 1 kohms each to approach 16 kohms per slice. Aggregating the output impedances from the other bit-slices in parallel results in an aggregate output impedance value close to the desired 50 ohms. While this may appear to address the problem of inaccurate output impedance, it may introduce additional capacitance to the output node which may alter the termination impedance at higher frequencies.

What is needed is an accurate and power-efficient method and apparatus to support output impedance tuning operations for a voltage-mode DAC driver.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Embodiments of apparatus and methods for digital-to-analog conversion are disclosed. For one embodiment, a voltage-mode digital-to-analog converter (DAC) is disclosed that input circuitry and an array of output impedance units disposed in parallel. The input circuitry receives a digital word of N bits. A selectable number of the output impedance units are activated to produce a desired aggregate output impedance. The selectable number is free to be a number different than N.

In a further embodiment, a method of operation in a voltage-mode DAC is disclosed. The method includes receiving a digital word of N bits; providing an array of output impedance units disposed in parallel; activating a selectable number of the output impedance units to produce a desired aggregate output impedance; and where the selectable number is free to be a number different than N.

In yet another embodiment, a voltage-mode driver is disclosed. The voltage-mode driver includes input circuitry to selectively receive one of N bits of a digital word. An output impedance unit is configured to be disposed in parallel with other output impedance units from other voltage-mode drivers to define an activated number of output impedance units to generate an aggregate output impedance. An enable input is responsive to an enable signal to activate the input circuitry. The activated number of output impedance units is free to be a number other than N.

Figure 1:
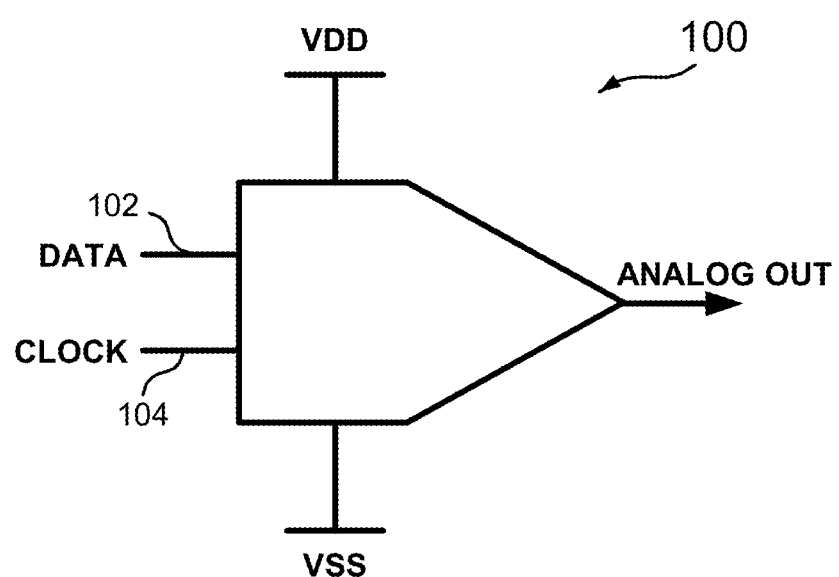
FIG. 1 illustrates a conventional digital-to-analog converter (DAC).
Figure 2:
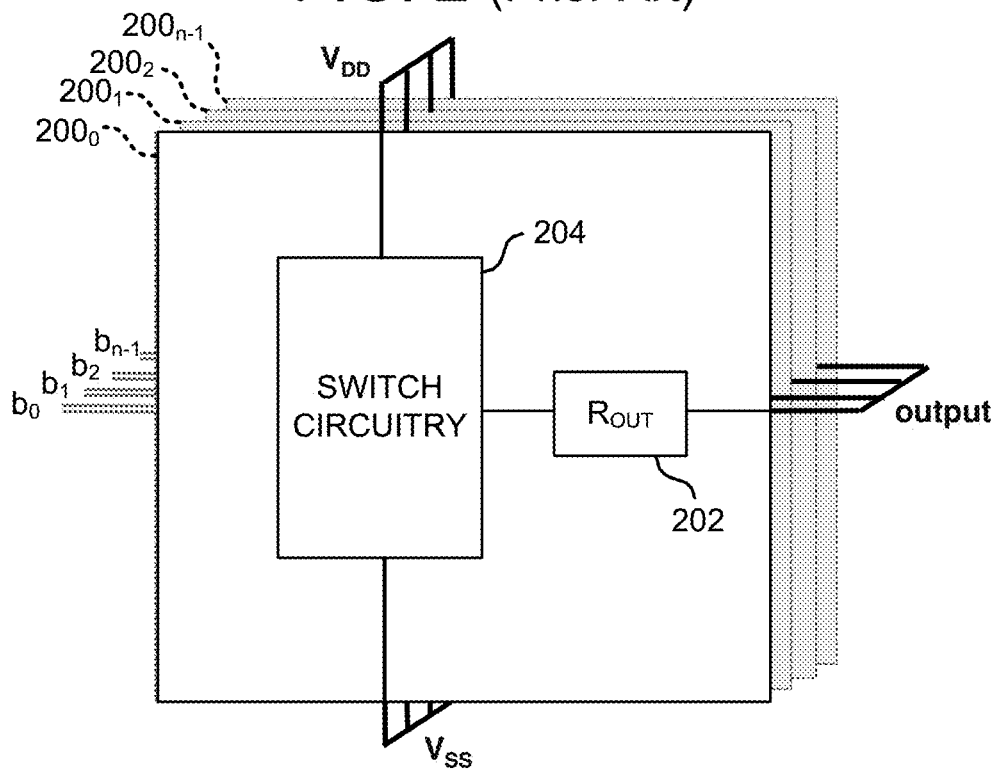
FIG. 2 illustrates further detail of the conventional DAC of FIG. 1.
Figure 3:
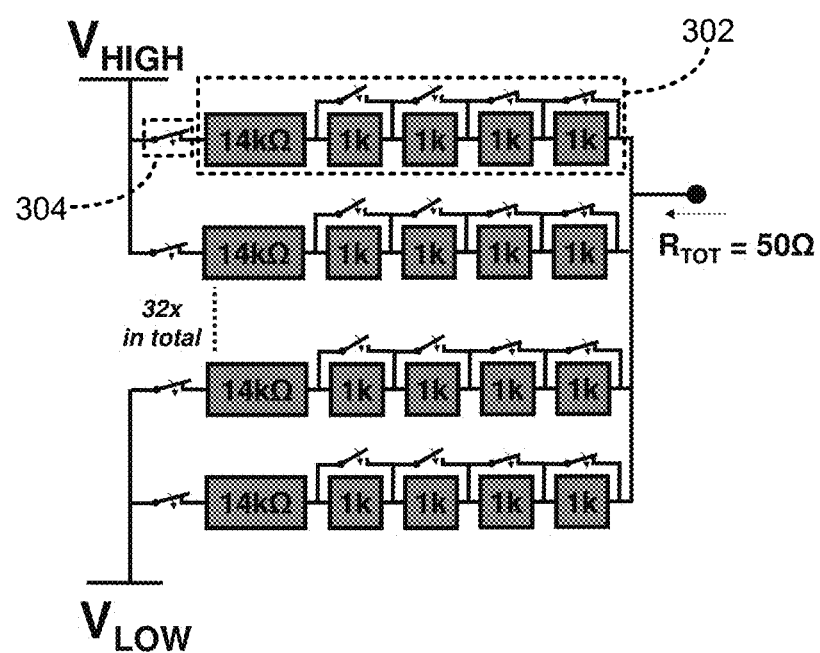
FIG. 3 illustrates further detail of the conventional DAC of FIG. 2.
Figure 4:
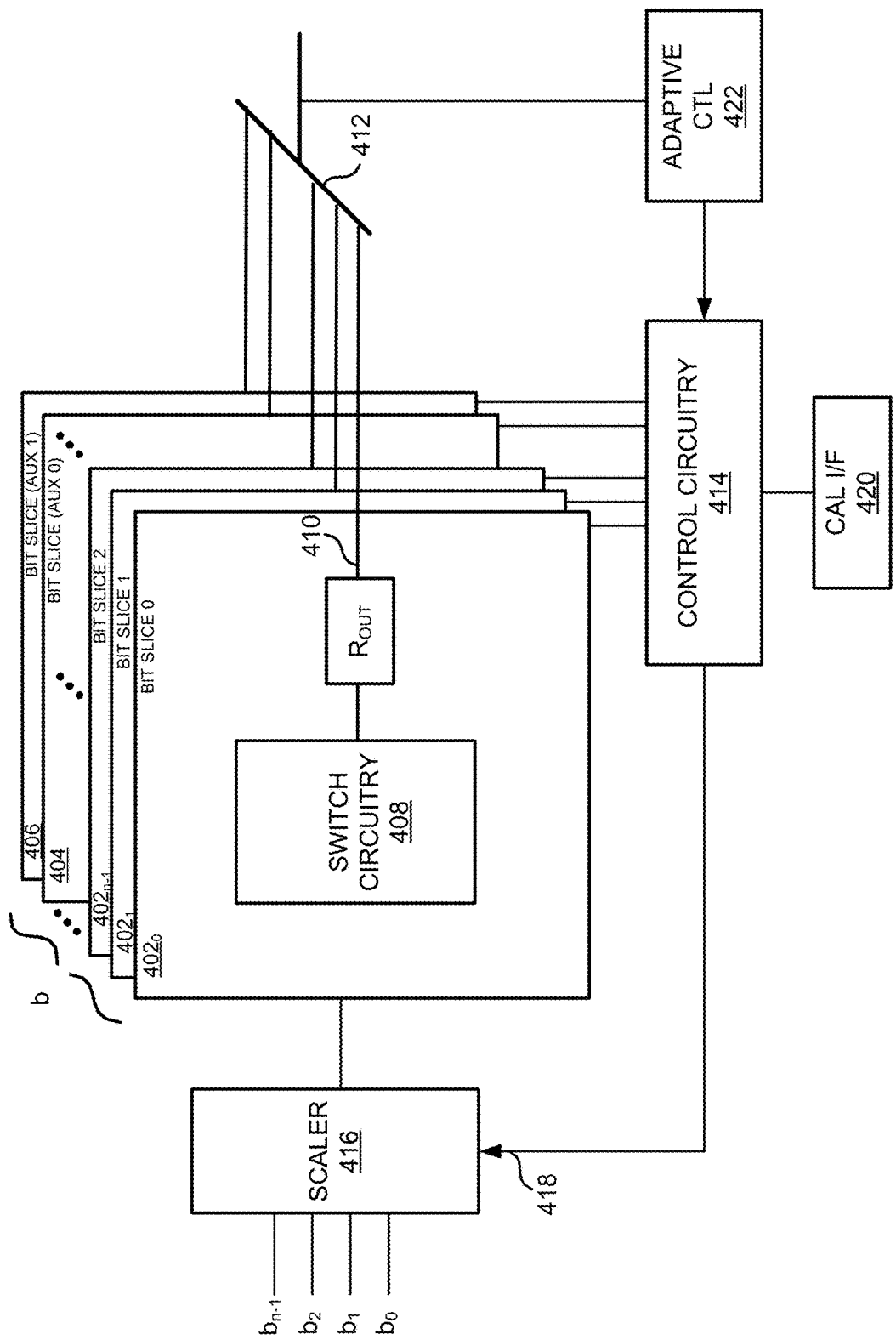
FIG. 4 illustrates one embodiment of an improved DAC architecture.

FIG. 4 illustrates a block diagram of one embodiment of a voltage-mode DAC architecture, generally designated 400, that provides for high-accuracy output impedance tuning. The architecture includes multiple bit processing circuits $402_0$-$402_{n-1}$ that generally correspond to a number "N" of bits $b_0$, $b_1$, $b_2$, $b_{N-1}$, in each DAC codeword. Additional bit processing circuits, such as at 404 and 406, are also provided as auxiliary bit slices for tuning an aggregate output impedance, as more fully discussed below. Each bit processing circuit includes switch circuitry 408 to selectively couple a supply voltage (not shown) or ground voltage (not shown) to an output node 410 via output impedance $R_{OUT}$. The output impedance selectively couples to an aggregate output node, at 412, based on whether the particular bit processing circuit is activated or enabled by control circuitry 414.

For one embodiment, the bit slice circuitry may take the form of the DAC driver circuitry described in copending U.S. patent application Ser. No. 16/354,512, filed Mar. 15, 2019, titled "Hybrid Return-to-Zero Voltage-Mode DAC Driver", assigned to the assignee of the present disclosure and incorporated by reference in its entirety herein.

With continued reference to FIG. 4, in some embodiments, the output impedance $R_{OUT}$ may be a fixed value, such as 16 kohm. Such a value enables aggregating a parallel output impedance of approximately 50 ohms, to match a given line characteristic impedance. For other embodiments, each bit slice output impedance may be a different value, as long as the values relative to each other are known. Aggregating all of the separate output impedances in parallel thus generates an aggregate resulting impedance. By adding or decreasing the number of bit slices, a desired aggregate output impedance may be "tuned" to a desired value of, for example, 50 ohms. Changing the number of bit slice circuits to a number other than the number of input bits N for a received input codeword, however, involves scaling of the input codeword.

Further referring to FIG. 4, in order to carry out a scaling of the input codeword, the DAC architecture 400 includes a scaler 416. The scaler receives the N-bit codeword and responds to a control input, at 418, from control circuitry 414, to selectively scale the input codeword from N bits to a number of bits that may be greater than N or less than N. For one embodiment, the scaling is based on the number of bit slice processing circuits 402 activated to produce a desired output impedance as described above.

In some embodiments, the value of $R_{OUT}$ per slice does not have to be equal between the slices. As an example the resistance in the auxiliary slices may also be changing in a power-of-2 fashion, e.g. aux-0 also has $R_{OUT}$ as resistance, but aux-1 has $2 \times R_{OUT}$, a possible aux-3 has $4 \times R_{OUT}$ etc. This allows for further fine-tuning of the total resistance and it only requires the scaler 416 to be aware of the actual resistances per slice, either by design or via measurements of the actual resistances, such that the input data can be converted appropriately to the slices which are active.

For some embodiments, the DAC architecture 400 includes a calibration interface 420 accessible by a user to program impedance tuning parameters to achieve an optimum output impedance. The programmability may be carried out during manufacture, or via a port accessible in the field.

Further referring to FIG. 4, for one embodiment, the DAC architecture 400 may optionally provide adaptive tuning capability. An adaptive control unit 422 monitors the aggregate output impedance node, at 412, and feeds back a control signal to the control circuitry 414. The control signal may indicate an actual impedance value, or an error indicator. The control circuitry 414 responds to the control signal to tune the aggregate output impedance by adding or decreasing bit slices, as described above, and scaling the input codeword.

Figure 5:
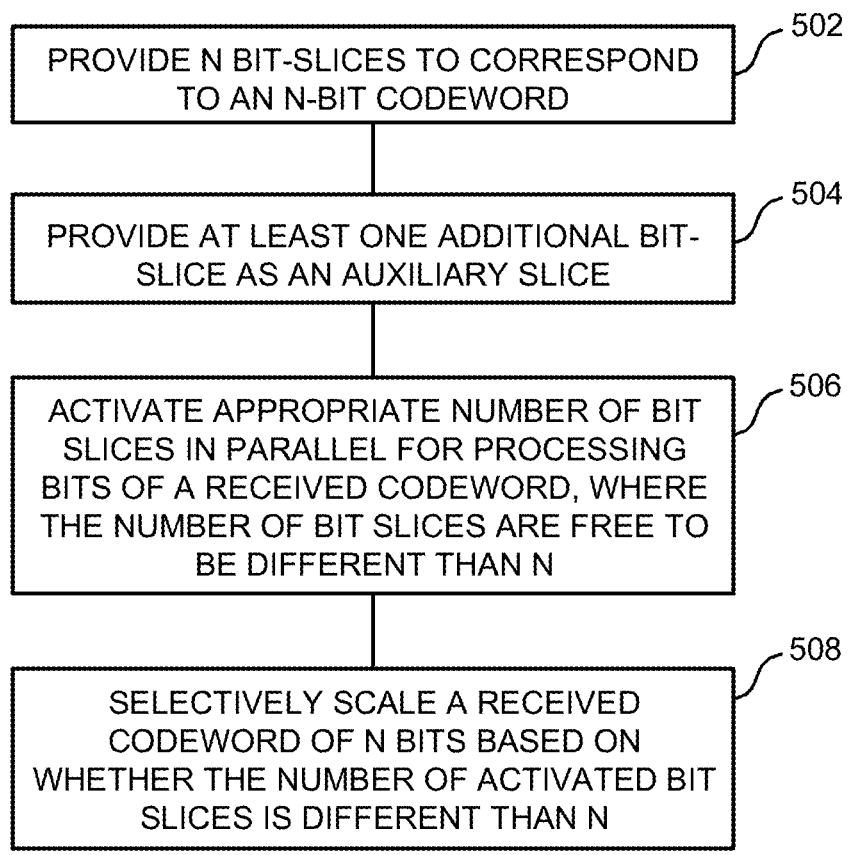
FIG. 5 illustrates a flowchart of steps that may be performed in a method of operating a DAC such as that shown in FIG. 4.

In operation, and referring now to FIG. 5, the DAC architecture of FIG. 4 may be provided in, for example, a high-speed Ethernet physical layer (PHY), to carry out digital-to-analog conversion with a high-level of precision. The DAC thus provides, at 502, N bit processing slices, with each bit processing slice corresponding to an N-bit codeword. Additional bit processing slices are also provided, at 504, as auxiliary bit processing slices. At 506, as a step during manufacture, or during an optional adaptive process, an appropriate number of bit processing slices are activated in parallel for processing bits of the received codeword. To tune the aggregate output impedance, the number of activated bit processing slices may be larger (to further reduce the impedance) or smaller (to increase the impedance) than the number "N" of input codeword bits. Of course, in some circumstances, the number of bit processing slices may match up to the number of input codeword bits while generating an optimum aggregate output impedance. In the event the number of activated bit processing slices is different than the number of codeword bits, then the codeword may be scaled, at 508.

As noted above, the multiple bit processing circuits are configured and aggregated such that a multi-bit codeword having, for example, a 32-bit resolution (a default of thirty-two bit processing circuits and additional auxiliary circuits provided in parallel to an aggregated output), can be processed during a given bit time to produce a corresponding analog voltage at the aggregated output. However, by providing the tuning capability described herein, the 32-bit resolution may be scaled consistent with increasing or decreasing the number of bit processing circuits to achieve an optimal aggregate output impedance with minimal power dissipation.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

I claim:

1. A voltage-mode digital-to-analog converter (DAC), comprising:
   input circuitry to receive a digital word of N bits;
   an array of output impedance units disposed in parallel;
   wherein a configurably selectable number of the output impedance units are activated to produce a desired aggregate output impedance; and
   wherein the configurably selectable number is free to be a number different than N.

2. The voltage-mode DAC according to claim 1, wherein the configurably selectable number is less than N.

3. The voltage-mode DAC according to claim 1, wherein the configurably selectable number is greater than N.

4. The voltage-mode DAC according to claim 1, wherein the input circuitry includes a scaler to scale the digital word of N bits.

5. The voltage-mode DAC according to claim 4, wherein the scaler is operative to convert the digital word of N bits to a number of bits other than N that corresponds to the number of activated output impedance units.

6. The voltage-mode DAC according to claim 1, wherein each of the output impedance units exhibits a same resistance value.

7. The voltage-mode DAC according to claim 1, wherein each of the output impedance units exhibits a resistance value that is free to be different from resistance values exhibited by other output impedance units.

8. A method of operation in a voltage-mode DAC, the method comprising:
   receiving a digital word of N bits;
   providing an array of output impedance units disposed in parallel;
   activating a configurably selectable number of the output impedance units to produce a desired aggregate output impedance; and
   wherein the configurably selectable number is free to be a number different than N.

9. The method according to claim 8, wherein the configurably selectable number is greater than N.

10. The method according to claim 8, wherein the configurably selectable number is less than N.

11. The method according to claim 8, further comprising:
    scaling the digital word of N bits based on the activated selectable number of output impedance units.

12. The method according to claim 11, wherein the scaling comprises:
    converting the digital word of N bits to a number of bits other than N that corresponds to the number of activated output impedance units.

13. The method according to claim 8, wherein the activating is carried out via a calibration interface.

14. The method according to claim 8, wherein the activating is carried out adaptively in response to an adaptive module.

15. A voltage-mode driver, comprising:
    input circuitry to selectively receive one of N bits of a digital word;
    an output impedance unit configured to be disposed in parallel with other output impedance units from other voltage-mode drivers to define an activated number of output impedance units to generate an aggregate output impedance;
    an enable input responsive to an enable signal to activate the input circuitry; and
    wherein the activated number of output impedance units is free to be a number other than N.

16. The voltage-mode driver of claim 15, wherein the output impedance units exhibit a same resistance value.

17. The voltage-mode driver of claim 15, wherein the output impedance units exhibit a resistance value that is free to be different from resistance values exhibited by other output impedance units.

* * * * *